(12) United States Patent
Luo et al.

(10) Patent No.: US 12,514,095 B2
(45) Date of Patent: Dec. 30, 2025

(54) DISPLAY SUBSTRATES AND MANUFACTURING METHODS THEREOF, AND DISPLAY DEVICES

(71) Applicant: BOE Technology Group Co., Ltd., Beijing (CN)

(72) Inventors: Chengyuan Luo, Beijing (CN); Xiaolei Zhang, Beijing (CN); Xiaohu Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 1098 days.

(21) Appl. No.: 17/607,813

(22) PCT Filed: Feb. 7, 2021

(86) PCT No.: PCT/CN2021/075887
§ 371 (c)(1),
(2) Date: Oct. 29, 2021

(87) PCT Pub. No.: WO2021/164602
PCT Pub. Date: Aug. 26, 2021

(65) Prior Publication Data
US 2022/0238614 A1    Jul. 28, 2022

(30) Foreign Application Priority Data
Feb. 18, 2020  (CN) .................. 202010099655.4

(51) Int. Cl.
*H10K 59/80* (2023.01)
*H10K 59/12* (2023.01)
(Continued)

(52) U.S. Cl.
CPC ..... *H10K 59/80524* (2023.02); *H10K 59/122* (2023.02); *H10K 59/124* (2023.02); *H10K 59/1201* (2023.02); *H10K 59/65* (2023.02)

(58) Field of Classification Search
CPC .. H10K 59/122; H10K 50/822; H10K 59/124; H10K 59/80524; H10K 59/131
See application file for complete search history.

(56) References Cited

U.S. PATENT DOCUMENTS 10,510,812 B2    12/2019  Lamkin et al.
2016/0043341 A1*  2/2016  Heo ............. H10K 59/122
                                                 438/23
(Continued)

FOREIGN PATENT DOCUMENTS

CN    109119451 A    1/2019
CN    109722629 A    5/2019
(Continued)

OTHER PUBLICATIONS

Machine translation of CN-111916485-A (Year: 2019).*
CN2020100996554 first office action.
PCT/CN2021/075887 international search report.

*Primary Examiner* — Nicholas J Tobergte
*Assistant Examiner* — Adin Hrnjic
(74) *Attorney, Agent, or Firm* — IPro, PLLC

(57) ABSTRACT

A display substrate includes a first display region disposed on a substrate, wherein the first display region includes a plurality of light-emitting regions arranged in an array and a plurality of light-transmitting regions arranged in an array. The plurality of light-emitting regions and the plurality of light-transmitting regions are arranged alternately. Each of the light-emitting regions includes: a conductive layer disposed in the light-emitting region; and a cathode block disposed on the conductive layer. The first display region further includes connection portions that are disposed in the light-transmitting regions and located in a same layer and made of a same material as the conductive layers, and respectively configured to electrically connect cathode (Continued)

blocks of two adjacent light-emitting regions. Further provided is a manufacturing method of a display substrate.

18 Claims, 4 Drawing Sheets

(51) Int. Cl.
*H10K 59/122* (2023.01)
*H10K 59/124* (2023.01)
*H10K 59/65* (2023.01)

(56) References Cited

U.S. PATENT DOCUMENTS

| | | | |
|---|---|---|---|
| 2020/0075688 A1 | 3/2020 | Xiao et al. | |
| 2020/0111848 A1* | 4/2020 | Joo | H10K 50/824 |
| 2021/0167320 A1* | 6/2021 | Kim | H10K 50/822 |
| 2021/0248945 A1* | 8/2021 | Liu | H04N 23/57 |
| 2021/0327958 A1 | 10/2021 | Li et al. | |

FOREIGN PATENT DOCUMENTS

| | | | | |
|---|---|---|---|---|
| CN | 109886140 A | | 6/2019 | |
| CN | 110189639 A | | 8/2019 | |
| CN | 110391348 A | | 10/2019 | |
| CN | 110649177 A | | 1/2020 | |
| CN | 110797379 A | | 2/2020 | |
| CN | 111916485 A | * | 11/2020 | H01L 27/3234 |
| JP | 2010230797 A | | 10/2010 | |

* cited by examiner

DISPLAY SUBSTRATES AND MANUFACTURING METHODS THEREOF, AND DISPLAY DEVICES

CROSS-REFERENCE TO RELATED APPLICATIONS

This application is the U.S. national phase of PCT Application No. PCT/CN2021/075887, filed on Feb. 7, 2021, which claims priority to Chinese Patent Application No. 202010099655.4, titled "ELECTRONIC DEVICES", filed on Feb. 18, 2020, the contents of all of which are incorporated herein by reference in their entirety for all purposes.

TECHNICAL FIELD

Embodiments of the present disclosure relate to display substrates and manufacturing methods thereof, and display devices.

BACKGROUND

With rapid development of electronic devices, users have higher and higher requirements for screen-to-body ratios. To improve full-screen display of an electronic device, a display region with high light transmittance is disposed in a screen, and elements such as a front camera and a light sensor are disposed under the display region.

SUMMARY

At least some embodiments of the present disclosure provide a display substrate, including a first display region disposed on a substrate. The first display region includes a plurality of light-emitting regions and a plurality of light-transmitting regions, the plurality of light-emitting regions are arranged in an array, the plurality of light-transmitting regions are arranged in an array, and the plurality of light-emitting regions and the plurality of light-transmitting regions are arranged alternately;

Each of the plurality of light-emitting regions includes:
a conductive layer disposed in the light-emitting region; and
a cathode block disposed on the conductive layer.

The first display region further includes a plurality of connection portions. The connection portions are disposed in the light-transmitting regions respectively, located in a same layer and made of a same material as the conductive layers, and respectively configured to electrically connect cathode blocks of two adjacent light-emitting regions.

In an embodiment of the present disclosure, the display substrate includes a pixel circuit layer, and the pixel circuit layer includes the conductive layers.

In an embodiment of the present disclosure, the pixel circuit layer includes a thin film transistor, the thin film transistor includes a gate electrode, and the conductive layer is the gate electrode.

In an embodiment of the present disclosure, the pixel circuit layer includes a thin film transistor, the thin film transistor includes a source electrode, and the conductive layer is the source electrode.

In an embodiment of the present disclosure, the pixel circuit layer includes a capacitor. The capacitor includes a first plate and a second plate. The second plate is located above the first plate, and the conductive layer is the second plate.

In an embodiment of the present disclosure, the light-emitting region further includes a plurality of anodes and an organic light-emitting material. The anodes are disposed on the pixel circuit layer. The organic light-emitting material is disposed between the anodes and the cathode block, and the conductive layer is the anodes.

In an embodiment of the present disclosure, an orthographic projection of the connection portion on the substrate overlaps with an orthographic projection of the cathode block in electrical connection with the connection portion on the substrate.

In an embodiment of the present disclosure, a size of an overlapping portion of the orthographic projection of the connection portion on the substrate and the orthographic projection of the cathode block in electrical connection with the connection portion on the substrate is in the range of [500 μm, 1000 μm] in a first direction. The first direction is a direction pointing to a light-emitting region from a light-transmitting region.

In an embodiment of the present disclosure, in the first display region, a ratio of a total area of the light-emitting regions to a total area of the light-transmitting regions is in the range of 1:1 to 1:2.

In an embodiment of the present disclosure, at least two connection portions are disposed in each of the plurality of light-transmitting regions. Along an extension direction of the light-transmitting regions, the at least two connection portions are arranged in parallel in a direction parallel to the first direction.

In an embodiment of the present disclosure, the display substrate further includes a second display region, and a light transmittance of the second display region is smaller than a light transmittance of the first display region.

At least one embodiment of the present disclosure provides a display device including the above display substrate.

At least one embodiment of the present disclosure provides a manufacturing method of a display substrate, the display substrate includes a first display region; the first display region includes a plurality of light-emitting regions and a plurality of light-transmitting regions, the plurality of light-emitting regions are arranged in an array, the plurality of light-transmitting regions are arranged in an array, and the plurality of light-emitting regions and the plurality of light-transmitting regions are arranged alternately;

The manufacturing method of the display substrate includes:
providing a substrate;
forming a conductive layer located in each of the plurality of light-emitting regions and a connection portion located in each of the plurality of light-transmitting regions on the substrate, where the conductive layers and the connection portions are formed in a same process procedure; and
forming a plurality of cathode blocks on the conductive layers, where the cathode blocks cover the light-emitting regions respectively, and the cathode blocks of two adjacent light-emitting regions are electrically connected by the connection portion in the light-transmitting region between the two adjacent light-emitting regions.

In an embodiment of the present disclosure, the display substrate includes a pixel circuit layer. The pixel circuit layer includes a plurality of thin film transistors. Each of the thin film transistors includes a gate electrode, and the conductive layer is the gate electrode.

In an embodiment of the present disclosure, the pixel circuit layer further includes a plurality of capacitors. Each of the capacitors includes a first plate and a second plate. The first plates and the conductive layers are formed in a same process procedure. After the conductive layers and the connection portions are formed on the substrate, the manufacturing method further includes:

forming a capacitor insulation layer covering the first display region on the gate electrodes and etching the capacitor insulation layer to expose the connection portions;

forming the second plates on the capacitor insulation layer;

forming an interlayer dielectric layer covering the first display region on the second plates and etching the interlayer dielectric layer to expose the connection portions;

forming source electrodes and drain electrodes on the interlayer dielectric layer;

forming a planarization layer covering the first display region on the source electrodes and etching the planarization layer to expose the connection portions;

forming a plurality of anodes on the planarization layer; and forming a pixel defining layer covering the first display region on the anodes and etching the pixel defining layer to expose the connection portions.

In an embodiment of the present disclosure, the pixel circuit layer further includes a plurality of capacitors. Each of the capacitors includes a first plate and a second plate. The first plates and the conductive layers are formed in a same process procedure. After the conductive layers and the connection portions are formed on the substrate, the manufacturing method further includes:

forming a capacitor insulation layer covering the first display region on the gate electrodes;

forming the second plates on the capacitor insulation layer;

forming an interlayer dielectric layer covering the first display region on the second plates;

forming source electrodes and drain electrodes on the interlayer dielectric layer;

forming a planarization layer covering the first display region on the source electrodes;

forming a plurality of anodes on the planarization layer;

forming a pixel defining layer covering the first display region on the anodes; and etching the pixel defining layer, the planarization layer, the interlayer dielectric layer and the capacitor insulation layer simultaneously to expose the connection portions.

In an embodiment of the present disclosure, forming the plurality of cathode blocks on the conductive layers, includes:

providing a mask, including a plurality of openings corresponding to the plurality of cathode blocks;

placing the mask on the conductive layers, where an orthographic projection of an opening corresponding to each of the cathode blocks on the substrate overlaps with an orthographic projection of the connection portion adjacent to the opening on the substrate; and forming the plurality of cathode blocks through the openings of the mask.

In an embodiment of the present disclosure, along a direction pointing to a light-emitting region to a light-transmitting region, a size of an overlapping portion of the orthographic projection of the opening on the substrate and the orthographic projection of the connection portion adjacent to the opening on the substrate is in the range of [500 µm, 1000 µm].

DETAILED DESCRIPTION OF THE EMBODIMENTS

Figure 1:
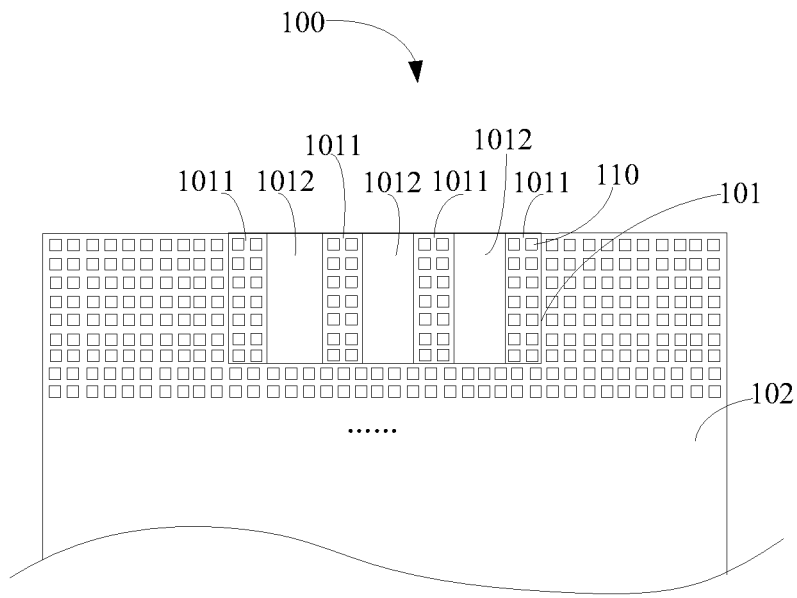
FIG. 1 is a structural schematic diagram of a display substrate according to an embodiment of the present disclosure.

Embodiments will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

The terms used in the present disclosure are for the purpose of describing particular embodiments only, and are not intended to limit the present disclosure. Terms "a", "the" and "said" in their singular forms in the present disclosure and the appended claims are also intended to include a plurality, unless clearly indicated otherwise in the context. It should also be understood that the term "and/or" as used herein refers to and includes any and all possible combinations of one or more of the associated listed items.

It is to be understood that although different information may be described using the terms such as first, second and third in the present disclosure, the information should not be limited to these terms. These terms are used only to distinguish the same type of information from each other. For example, the first information may also be referred to as the second information without departing from the scope of the present disclosure, and similarly, the second information may also be referred to as the first information. Depending on the context, the word "if" as used herein may be interpreted as "when" or "as" or "determining in response to".

A display substrate and a manufacturing method thereof, and a display device according to an embodiment of the present disclosure will be described in detail below in combination with the drawings. The features in the following embodiments may be supplemented or combined with each other in a case of no conflicts.

In embodiments of the present disclosure, for ease of description, a direction from a substrate to a conductive layer is defined as up, and a direction from the conductive layer to the substrate is defined as down, so as to determine the up and down directions. It is easily understood that different direction defining manners will not affect actual operation contents of processes and actual morphology of products.

At least some embodiments of the present disclosure provide a display substrate. As shown in FIG. 1, the display substrate 100 includes a first display region 101 and a second display region 102, and a light transmittance of the first display region 101 is greater than a light transmittance of the second display region 102. The first display region 101 includes a plurality of light-emitting regions 1011 and a plurality of light-transmitting regions 1012. The plurality of light-emitting regions 1011 are arranged in an array, the plurality of light-transmitting regions 1012 are arranged in an array, and the plurality of light-emitting regions and the plurality of light-transmitting regions are arranged alternately. When the display substrate 100 performs displaying, the first display region 101 may be used to display picture portions not requiring high quality display effect, such as an icon indicating a power level, and an icon indicating time, and the second display region 102 may be used to display images or videos.

A plurality of sub-pixels 110 are disposed in the second display region 102 and the light-emitting regions 1011 respectively such that the first display region 101 and the second display region 102 can perform displaying. Since no sub-pixels are disposed in the plurality of light-transmitting regions 1012 of the first display region 101, the light transmittance of the first display region 101 is higher, and thus a larger amount of external light can enter, through the first display region 101, light sensing elements such as a front camera, an infrared lens and a light sensor disposed under the first display region 101, thereby ensuring normal operations of the light sensing elements.

As shown in FIGS. 2-5, the sub-pixel 110 includes an anode 113, an organic light-emitting material 112 located on the anode 113 and a cathode 111 located on the organic light-emitting material 112. The cathodes 111 of sub-pixels in the second display region 102 are connected into one cathode block. The cathodes 111 of sub-pixels in the light-emitting region 1011 may be connected into one cathode block, and the cathode blocks of adjacent light-emitting regions 1011 may be electrically connected. The cathode block of the second display region 102 and the cathode blocks of the light-emitting regions 1011 may be connected.

The display substrate 100 includes a substrate 10, a conductive layer 20 and connection portions 30 both disposed on the substrate 10, and a cathode layer disposed on the conductive layer 20.

The conductive layer 20 is located in the second display region 102 and the light-emitting regions 1011, and the connection portions 30 are located in the light-transmitting regions 1012. An area of a connection portion 30 is smaller than an area of a light-transmitting region 1012. The conductive layer 20 and the connection portions 30 are located in a same layer and made of a same material. The cathode layer includes a plurality of cathode blocks located in the first display region and the second display region. A cathode block covers the second display region 102 or the light-emitting region 1011, and the cathode blocks of two adjacent light-emitting regions 1011 are electrically connected by the connection portion 30 between the two adjacent light-emitting regions 1011.

The display substrate 100 provided by an embodiment of the present disclosure includes a first display region 101 and a second display region 102. The light transmittance of the first display region 101 is greater than the light transmittance of the second display region 102. In this case, the light sensing elements may be disposed under the first display region 101, so as to realize full-screen display of the display substrate under the precondition of ensuring the normal operation of the light sensing elements. The connection portions 30 are disposed in the light-transmitting regions 1012 to electrically connect the cathode blocks of two adjacent light-emitting regions, thereby ensuring normal display of the display substrate 100. Furthermore, the disposal of the connection portions 30 can reduce the area of the cathode block in the light-transmitting regions 1012, helping to increase the light transmittance of the first display region 101. The conductive layer 20 and the connection portions 30 of the display substrate 100 are located in a same layer and made of the same material, and therefore the conductive layer 20 and the connection portions 30 can be formed in a same process procedure. As a result, the formation of the connection portions 30 will not increase the number of masks, thereby facilitating lowering complexity of the manufacturing process.

In an embodiment of the present disclosure, forming the conductive layer 20 and the connection portions 30 in a same process procedure means that the conductive layer 20 and the connection portions 30 are formed simultaneously in one patterning process.

In an embodiment of the present disclosure, the display substrate 100 includes a pixel circuit layer 27, and the pixel circuit layer 27 includes the conductive layer 20.

The pixel circuit layer is disposed on the substrate 10 and located between the sub-pixels 110 and the substrate 10. The pixel circuit layer 27 includes pixel circuits for driving the sub-pixels 110. The pixel circuit includes one or more thin film transistors 25 and one or more capacitors 26. The thin film transistor 25 includes a source electrode 251, a drain electrode 252, a gate electrode 253 and a semi-conductor layer 254. The capacitor 26 includes a first plate 261 and a second plate 262 that is located above the first plate 261 and insulated apart from the first plate 261. The first plate 261 and the gate electrode 253 may be located in a same layer and formed in a same process procedure. The conductive layer 20 may be an electrode in the thin film transistor, or may be the second plate 262 of the capacitor 26.

The display substrate 100 may further include a buffer layer 41 disposed between the substrate 10 and the semi-conductor layer 254. The pixel circuit layer 27 may further include a gate insulation layer 42 disposed between the semi-conductor layer 254 and the gate electrode 253, a capacitor insulation layer 43 disposed between the first plate 261 and the second plate 262, an interlayer dielectric layer 44 disposed between the second plate 262 and the source electrode 251 and a planarization layer 45 disposed between the source electrode 251 and the anode 113. The display substrate 100 may further include a pixel defining layer 46 disposed on the planarization layer 45. Pixel openings in one-to-one correspondence with the anodes 113 are disposed in the pixel defining layer 46 to expose a part of the corresponding anode 113, and the organic light-emitting material 112 is disposed in the pixel openings.

In an embodiment of the present disclosure, an orthographic projection of a film layer of the pixel circuit layer 27 located above the connection portion 30 on the substrate 10 does not overlap with an orthographic projection of the connection portion 30 on the substrate 10. An orthographic projection of the anode 113 on the substrate 10 does not overlap with the orthographic projection of the connection portion 30 on the substrate 10. An orthographic projection of the organic light-emitting material 112 on the substrate 10 does not overlap with the orthographic projection of the connection portion 30 on the substrate 10. With such an arrangement, no pixel circuit layer, no anode 113 and no organic light-emitting material are disposed in the region above the connection portion 30, thereby facilitating increasing the light transmittance of the light-transmitting regions 1012.

Figure 2:
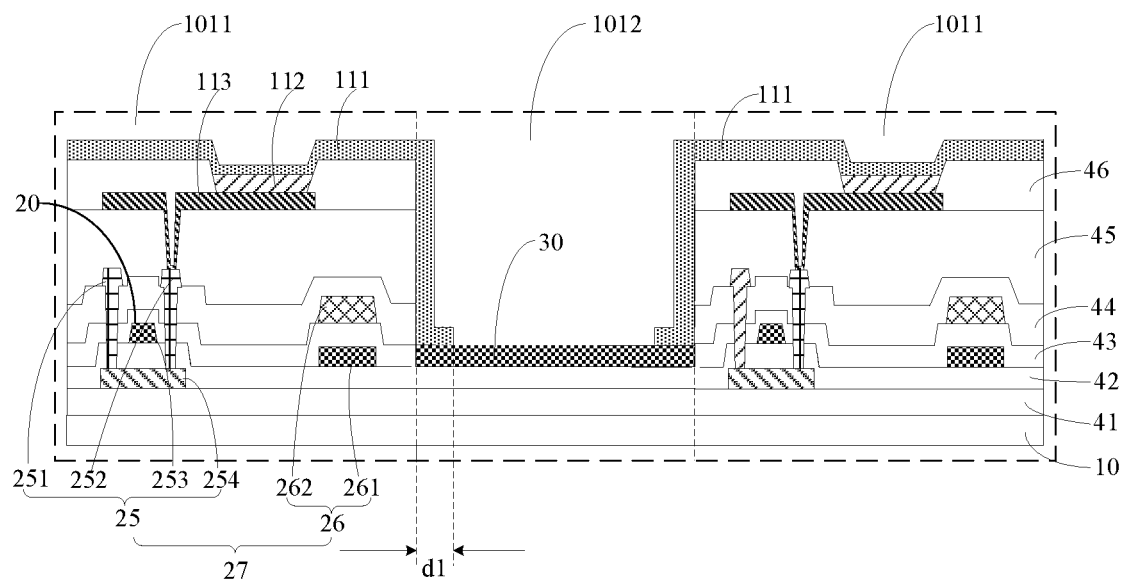
FIG. 2 is a partial sectional view of a display substrate according to an embodiment of the present disclosure.

In an embodiment of the present disclosure, as shown in FIG. 2, the conductive layer 20 is the gate electrode 253 of the thin film transistor 25, that is, the connection portion 30 and the gate electrode 253 are located in a same layer and made of a same material. Portions of the capacitor insulation layer 43, the interlayer dielectric layer 44, the planarization layer 45 and the pixel defining layer 46 that are located above the connection portion 30 are etched off to expose the connection portion 30. Thus, the cathode block of the light-emitting region 1011 is in direct contact with the adjacent connection portions 30, and the cathode blocks of two adjacent light-emitting regions 1011 are electrically connected by the connection portion 30.

The gate electrode 253 may be made of Mo, Nd or Al, and the connection portion 30 has the same material as the gate electrode 253 so that the connection portion 30 has good conductivity. A thickness of the gate electrode 253 is generally in the range of [560 nm, 770 nm], thicknesses of the source electrode 251 and the drain electrode 252 are generally in the range of [380 nm, 580 nm], and a thickness of the second plate 262 of the capacitor 26 is generally in the range of [350 nm, 550 nm]. Thus, it can be known that the thickness of the gate electrode 253 is greater than the thickness of the source electrode 251 and the thickness of the second plate 262; and when the connection portion 30 and the gate electrode 253 are formed simultaneously, the connection portion 30 has a large thickness and a small resistance. Therefore, when the conductive layer 20 is the gate electrode 253, the connection portion 30 has good conductivity and small resistance, so that a voltage drop is small and power consumption is low when the display substrate 100 performs displaying.

Figure 3:
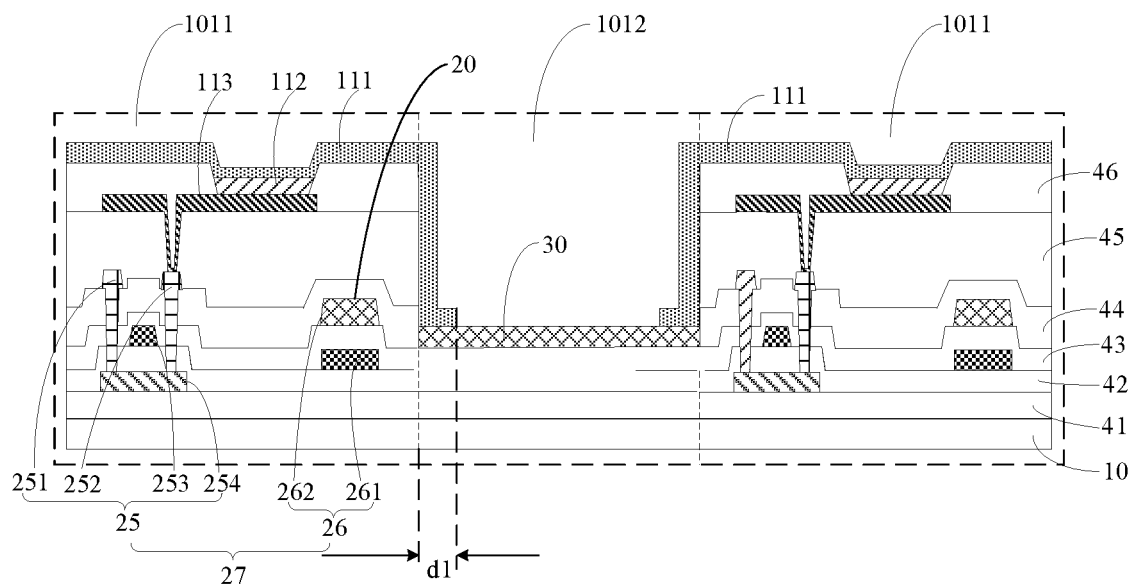
FIG. 3 is a partial sectional view of a display substrate according to another embodiment of the present disclosure.

In another embodiment of the present disclosure, as shown in FIG. 3, the conductive layer 20 is the second plate 262 of the capacitor 26, that is, the connection portion 30 and the second plate 262 of the capacitor 26 are located in a same layer and made of a same material. The portions of the interlayer dielectric layer 44, the planarization layer 45 and the pixel defining layer 46 that are located above the connection portion 30 are etched off to expose the connection portion 30. Thus, the cathode block of the light-emitting region 1011 is in direct contact with the adjacent connection portions 30, and the cathode blocks of two adjacent light-emitting regions 1011 are electrically connected by the connection portion 30.

Generally, the second plate 262 of the capacitor 26 is made of Mo, Ti or Cu having good conductivity, and the connection portion 30 is made of the same material as the second electrode 262 so that the connection portion 30 has good conductivity. Further, the connection portion 30 and the second plate 262 are located in a same layer to reduce a height difference between the connection portion 30 and the adjacent cathode block in a film layer stacking direction, thereby reducing a climbing difficulty of the cathode 111 during evaporation and lowering a risk of breakage of the cathode 111. Further, a small number of insulation layers located above the connection portion 30 may reduce a probability of over-etching when the insulation layers are etched.

Figure 4:
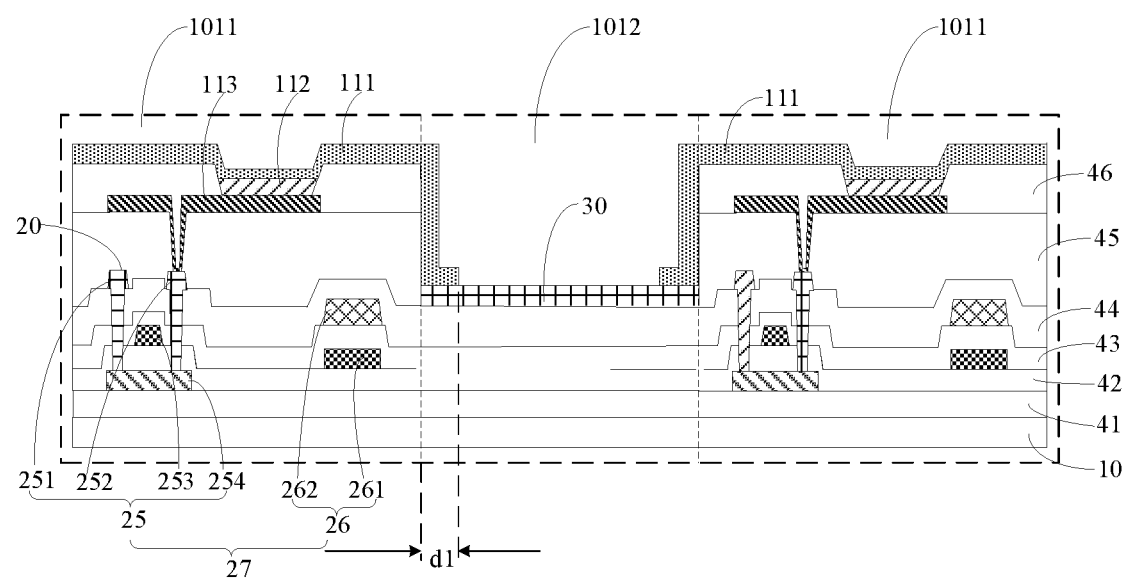
FIG. 4 is a partial sectional view of a display substrate according to still another embodiment of the present disclosure.

In still another embodiment of the present disclosure, as shown in FIG. 4, the conductive layer 20 is the source electrode 251, that is, the connection portion 30 and the source electrode 251 are located in a same layer and made of a same material. The portions of the planarization layer 45 and the pixel defining layer 46 located above the connection portion 30 are etched off to expose the connection portion 30. Thus, the cathode block of the light-emitting region 1011 is in direct contact with the adjacent connection portions 30, and the cathode blocks of two adjacent light-emitting regions 1011 are electrically connected by the connection portion 30.

Generally, the source electrode 251 includes two Ti film layers and an Al film layer located between the two Ti film layers and has good conductivity. The connection portion 30 is made of the same material as the source electrode 251 so that the connection portion has good conductivity. Further, the connection portion 30 and the source electrode 251 are located in a same layer to reduce a height difference between the connection portion 30 and the adjacent cathode block in a film layer stacking direction, thereby reducing the climbing difficulty of the cathode 111 during evaporation and lowering the risk of breakage of the cathode 111. Furthermore, a smaller number of insulation layers located above the connection portion 30 may reduce the probability of over-etching when the insulation layers are etched.

Figure 5:
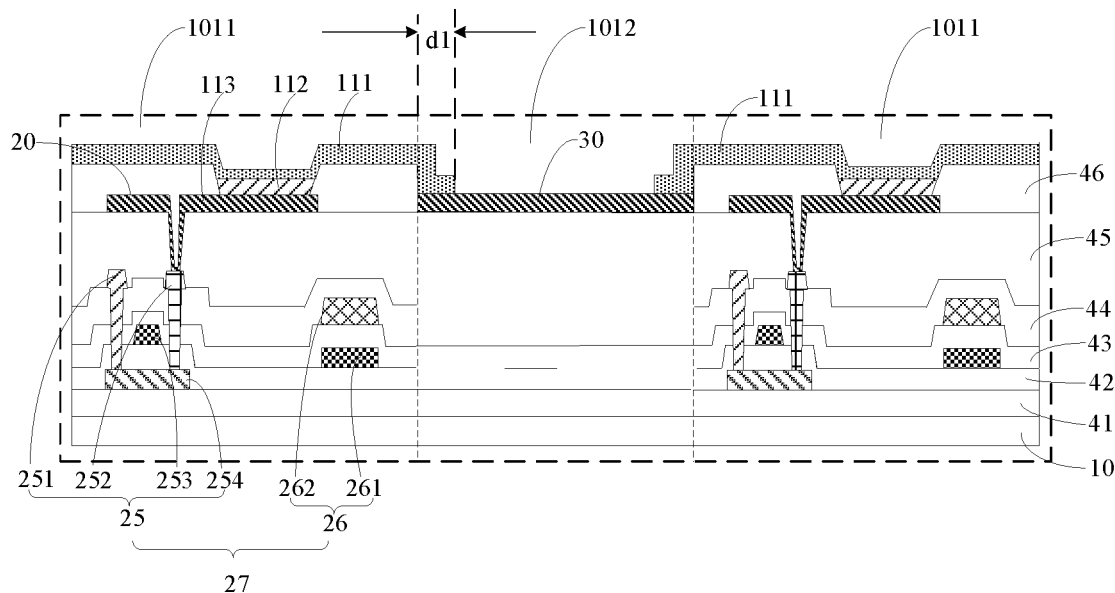
FIG. 5 is a partial sectional view of a display substrate according to yet another embodiment of the present disclosure.

In yet another embodiment of the present disclosure, as shown in FIG. 5, the conductive layer 20 is an anode 113, that is, the connection portion 30 and the anode 113 are located in a same layer and made of a same material. The portion of the pixel defining layer 46 located above the connection portion 30 is etched off to expose the connection portion 30, and thus the cathode block of the light-emitting region 1011 is in direct contact with the adjacent connection portions 30, and the cathode blocks of two adjacent light-emitting regions 1011 are electrically connected by the connection portion 30.

Locating the connection portion 30 and the anode 113 in a same layer may minimize a height difference between the connection portion 30 and the adjacent cathode block in a film layer stacking direction to further reduce the climbing difficulty of the cathode 111 during evaporation and lower the risk of breakage of the cathode 111, thereby ensuring the electrical connection of the connection portion 30 and the cathode 111. Further, the insulation layer above the connection portion 30 includes only the pixel defining layer 46, which further reduces the probability of over-etching when the insulation layer is etched.

In an embodiment of the present disclosure, an orthographic projection of the connection portion 30 on the substrate 10 overlaps with an orthographic projection of the cathode blocks in electrical connection with the connection portion 30 on the substrate 10. In this way, it is ensured that the connection portion 30 and the adjacent cathode blocks can achieve a good electrical connection effect.

Further, in a direction pointing to the light-emitting region 1011 from the light-transmitting region 1012, a size d1 of an overlapping portion of the orthographic projection of the connection portion 30 on the substrate 10 and the orthographic projection of the cathode block in electrical connection with the connection portion 30 on the substrate 10 is in the range of [500 µm, 1000 µm]. In this way, the size of an overlapping portion of the cathode block and the adjacent connection portion 30 is relatively large, which helps to avoid a bad electrical connection effect resulted from poor contact between the cathode block and the adjacent connection portion 30. In the direction pointing to the light-emitting region 1011 from the light-transmitting region 1012, the size d1 of the overlapping portion of the orthographic projection of the connection portion 30 on the substrate 10 and the orthographic projection of the cathode block in electrical connection with the connection portion 30 on the substrate 10 may be 500 µm, 600 µm, 700 µm, 800 µm, 900 µm, 1000 µm, or the like.

In an embodiment of the present disclosure, in the first display region 101, a ratio of a total area of the light-emitting regions 1011 to a total area of the light-transmitting regions 1012 is in the range of 1:1 to 1:2. In this case, it is ensured that the first display region 101 has a good display effect, and the light transmittance of the first display region 101 also satisfies requirements of light sensing elements disposed under the first display region 101. The ratio of the total area of the light-emitting regions 1011 to the total area of the light-transmitting regions 102 in the first display region 101 may be 1:1, 1:1.2, 1:1.4, 1:1.8, 1:2, or the like.

In an embodiment of the present disclosure, in the first display region 101, the sizes of the light-emitting region 1011 in a first direction and a second direction may be both in the range of [500 µm, 1000 µm]; and the sizes of the light-transmitting region 1012 in the first direction and the second direction may be both in the range of [500 µm, 1000 µm]. In an exemplary embodiment, in the first direction, the size of the light-emitting region 1011 may be 800 µm and the size of the light-transmitting region 1012 may be 500 µm; in the second direction, the size of the light-transmitting region 1012 may be 1000 µm. The first direction refers to a direction pointing to the light-transmitting region 1012 from the light-emitting region 1011, and the second direction refers to a direction perpendicular to the first direction along a surface of a display screen. In this way, a poor display effect of the first display region 101 resulting from a larger area of a single light-emitting region 1011 or a single light-transmitting region 1012 is avoided.

In an embodiment of the present disclosure, at least two connection portions 30 are disposed in a same light-transmitting region 1012, and arranged in an array along the second direction. The array arrangement of the at least two connection portions 30 refers to that two adjacent connection portions 30 are not in direct contact but disposed in a spacing. Arrangement of at least two connection portions 30 in a same light-transmitting region 1012 may further ensure the electrical connection effect of the cathode block and the adjacent connection portion 30. Further, with such an arrangement, the voltage drops at various positions of the light-emitting region 1011 are more approximate to each other, and the display effects of various positions of the light-emitting region 1011 are more consistent, thereby facilitating improving the use experiences of a user.

The display substrate according to an embodiment of the present disclosure includes a first display region and a second display region. The light transmittance of the first display region is greater than the light transmittance of the second display region. Therefore, one or more light sensing elements may be disposed under the first display region, so as to realize full-screen display of the display substrate under a precondition of normal operation of the one or more light sensing elements. One or more connection portions are formed in the light-transmitting region to electrically connect cathode blocks of two adjacent light-emitting regions, so that the cathode blocks of light-emitting regions in the first display region are electrically connected, thereby ensuring normal display of the display substrate. Further, the arrangement of the one or more connection portions may reduce an area of the cathode in the light-transmitting region, facilitating increasing the light transmittance of the first display region. Since the conductive layer and the connection portions of the display substrate may be formed in a same process procedure, the formation of the connection portions will not increase the number of masks, thereby facilitating reducing complexity of the manufacturing process.

An embodiment of the present disclosure further provides a manufacturing method of a display substrate. Referring to FIG. 1, the display substrate 100 includes a first display region 101 and a second display region 102, and a light transmittance of the first display region 101 is greater than a light transmittance of the second display region 102. The first display region 101 includes a plurality of light-emitting regions 1011 and a plurality of light-transmitting regions 1012. The plurality of light-emitting regions 1011 are arranged in an array, the plurality of light-transmitting regions 1012 are arranged in an array, and the plurality of light-emitting regions and the plurality of light-transmitting regions are arranged alternately.

A plurality of sub-pixels 110 are disposed in the second display region 102 and the light-emitting regions 1011 respectively, so that the first display region 101 and the second display region 102 can display images. No sub-pixels are disposed in the light-transmitting regions 1012 of the first display region 101, leading to a higher light transmittance of the light-transmitting regions 1012. Therefore, the light transmittance of the first display region 101 is higher and ambient light can enter, through the first display region 101, light sensing elements such as a front camera, an infrared lens and a light sensor disposed under the first display region 101.

Referring to FIGS. 2-5, the sub-pixel 110 includes an anode 113, an organic light-emitting material 112 located on the anode 113 and a cathode 111 located on the organic light-emitting material 112. The cathodes 111 of sub-pixels in the second display region 102 are connected into one cathode block, and the cathodes 111 of sub-pixels in the light-emitting region 1011 may be connected into one cathode block. The cathode blocks of adjacent light-emitting regions 1011 may be electrically connected, and the cathode block of the second display region 102 and the cathode blocks of the light-emitting regions 1011 may be connected.

Figure 6:
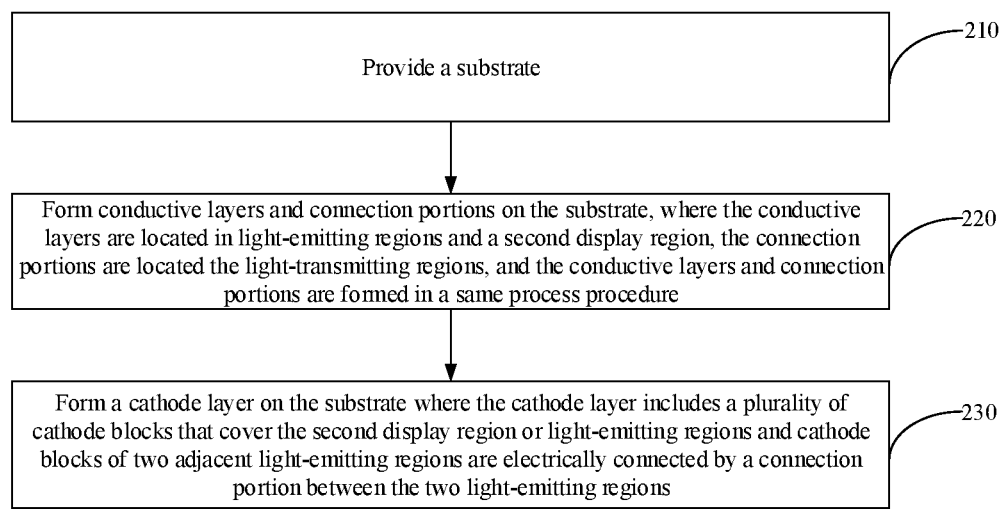
FIG. 6 is a flowchart of a manufacturing method of a display substrate according to an embodiment of the present disclosure.

The manufacturing method of a display substrate according to an embodiment of the present disclosure will be described in detail below with reference to FIG. 6. As shown in FIG. 6, the manufacturing method includes the following steps 210-230.

At step 210, a substrate is provided.

In an embodiment of the present disclosure, the substrate 10 may be a flexible substrate or a rigid substrate. The flexible substrate may be a transparent substrate prepared using one or more of polyethylene terephthalate (PET), polyimide (PI) and polycarbonate (PC), and the like. The rigid substrate may be, for example, a transparent substrate such as a glass substrate, a quartz substrate or a plastic substrate.

At step 220, a conductive layer located in each of a plurality of light-emitting regions and a connection portion located in each of a plurality of light-transmitting regions are formed on the substrate, where the conductive layer is located in the light-emitting regions, and the connection portion is located in the light-transmitting regions; and the conductive layer and the connection portion are formed in a same process procedure.

In an embodiment of the present disclosure, the display substrate 100 includes a pixel circuit layer 27, and the pixel circuit layer 27 includes the conductive layer.

The pixel circuit layer 27 is formed on the substrate 10 and located between the sub-pixels 110 and the substrate 10. The pixel circuit layer 27 includes pixel circuits for driving the sub-pixels 110. The pixel circuit includes one or more thin film transistors 25 and one or more capacitors 26. The thin film transistor 25 includes a source electrode 251, a drain electrode 252, a gate electrode 253 and a semiconductor layer 254. The capacitor 26 includes a first plate 261 and a second plate 262 that is located above the first plate 261 and insulated apart from the first plate 261. The first plate 261 of the capacitor 26 and the gate electrode 253 may be formed in a same process procedure.

In an embodiment of the present disclosure, as shown in FIG. 2, the conductive layer 20 is the gate electrodes 253 of the thin film transistors 25, that is, the connection portion 30 and the gate electrodes 253 are formed in a same process procedure.

The gate electrodes 253 may be made of Mo, Nd or Al, and the connection portion 30 is made of the same material as the gate electrodes 253 so that the connection portion 30 has good conductivity. A thickness of the gate electrodes 253 is generally in the range of [560 nm, 770 nm], and greater than a thickness of the source electrodes 251 and a thickness of the second plates 262 of the capacitors 26. When the connection portion 30 and the gate electrodes 253 are formed simultaneously, a thickness of the connection portion 30 is identical to the thickness of the gate electrodes 253. Therefore, when the conductive layer 20 is the gate electrodes 253, the thickness of the connection portion 30 may be relatively large so that the connection portion 30 possesses good conductivity and small resistance. Thus, a voltage drop is relatively small and power consumption is relatively low when the display substrate 100 performs displaying.

In an embodiment of the present disclosure, when the conductive layer 20 is the gate electrodes 253 of the thin film transistors 25, after step 220, the manufacturing method further includes the following steps 221-227 to form the pixel circuit layer 27 of the display substrate and the anodes of the sub-pixels.

At step 221, a capacitor insulation layer covering the first display region 101 and the second display region 102 is formed on the gate electrodes 253 and etched to expose the connection portion.

At step 222, second plates of the capacitors are formed on the capacitor insulation layer.

At this step, the second plates are formed only in the second display region 102 and the light-emitting regions 1011 and not formed in the light-transmitting regions 1012.

At step 223, an interlayer dielectric layer covering the first display region and the second display region is formed on the second plates and etched to expose the connection portion.

At step 224, source electrodes 251 and drain electrodes 252 are formed on the interlayer dielectric layer.

At this step, the source electrodes 251 and the drain electrodes 252 are formed only in the second display region 102 and the light-emitting regions 1011, and the source electrodes 251 and the drain electrodes 252 are not formed in the light-transmitting regions 1012.

At step 225, a planarization layer covering the first display region and the second display region is formed on the source electrodes 251 and etched to expose the connection portion.

At step 226, anodes are formed on the planarization layer.

At this step, the anodes are formed only in the second display region 102 and the light-emitting regions 1011 and not formed in the light-transmitting regions 1012.

At step 227, a pixel defining layer covering the first display region and the second display region is formed on the anodes and etched to expose the connection portion.

The pixel circuit layer 27 of the display substrate and the anodes 113 of the sub-pixels may be formed through step 220 and steps 222-227. At the above steps 222-227, the insulation layers above the connection portion 30 are removed while various insulation layers are etched, such that the connection portion 30 is exposed. Thus, etching the insulation layers above the connection portion 30 can be performed without using additional working procedure, thereby reducing process complexity.

In another embodiment of the present disclosure, when the conductive layer 20 is the gate electrodes 253 of the thin film transistors 25, after step 220, the manufacturing method further includes the following steps 228-235 to form the pixel circuit layer 27 of the display substrate and the anodes 113 of the sub-pixels.

At step 228, a capacitor insulation layer 43 covering the first display region 101 and the second display region 102 is formed on the gate electrodes 253.

At step 229, second plates 262 are formed on the capacitor insulation layer 43.

At this step, the second plates 262 are formed only in the second display region 102 and the light-emitting regions 1011, and not formed in the light-transmitting regions 1012.

At step 230, an interlayer dielectric layer 44 covering the first display region 101 and the second display region 102 is formed on the second plates 262.

At step 231, source electrodes 251 and drain electrodes 252 are formed on the interlayer dielectric layer 44.

At this step, the source electrodes 251 and the drain electrodes 252 are formed only in the second display region 102 and the light-emitting regions 1011 and not formed in the light-transmitting regions 1012.

At step 232, a planarization layer 45 covering the first display region 101 and the second display region 102 is formed on the source electrodes 251.

At step 233, anodes 113 are formed on the planarization layer 45.

At this step, the anodes are formed only in the second display region 102 and the light-emitting regions 1011 and not formed in the light-transmitting regions 1012.

At step 234, a pixel defining layer 46 covering the first display region 101 and the second display region 102 is formed on the anodes 113.

At step 235, the pixel defining layer 46, the planarization layer 45, the interlayer dielectric layer 44 and the capacitor insulation layer 43 are etched simultaneously to expose the connection portion 30.

The pixel circuit layer 27 of the display substrate 100 and the anodes 113 of the sub-pixels may be formed through step 220 and steps 228-235. At the above steps 228-235, the pixel defining layer 46, the planarization layer 45, the interlayer dielectric layer 44 and the capacitor insulation layer 43 are etched simultaneously to remove those portions above the connection portion 30 so as to expose the connection portion 30. Compared with a solution in which one insulation layer is removed in each etch, this solution helps to reduce a risk that the connection portion 30 is etched due to over-etching.

In another embodiment of the present disclosure, as shown in FIG. 3, the conductive layer 20 is the second plates 262 of the capacitors 26, that is, the connection portion 30 and the second plates 262 of the capacitors 26 are formed in a same process procedure.

In still another embodiment of the present disclosure, as shown in FIG. 4, the conductive layer 20 is the source electrodes 251, that is, the connection portion 30 and the source electrodes 251 are formed in a same process procedure.

In yet another embodiment of the present disclosure, as shown in FIG. 5, the conductive layer 20 is the anodes 113, that is, the connection portion 30 and the anodes 113 are formed in a same process procedure.

After the anodes 113 are formed, the manufacturing method of the display substrate may further include: forming an organic light-emitting material 112 above the anodes 113.

Figure 7:
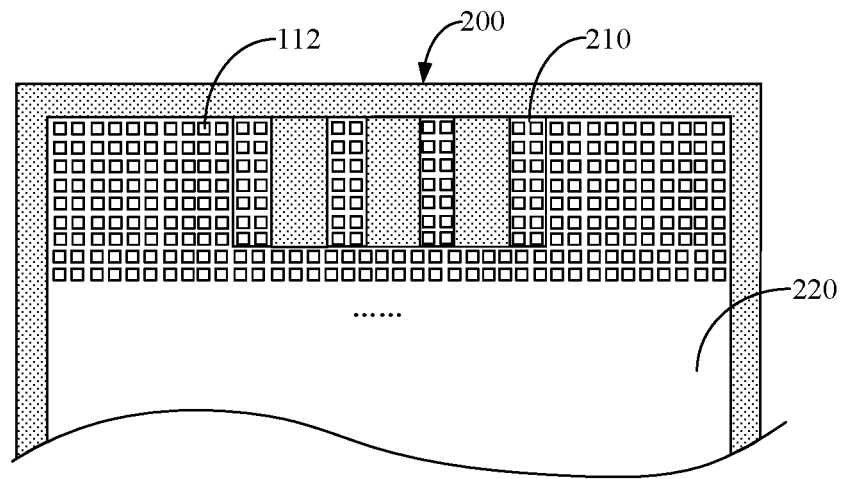
FIG. 7 is a schematic diagram of evaporating an organic light-emitting material using a mask according to an embodiment of the present disclosure.

When the organic light-emitting material 112 is formed, a mask 200 as shown in FIG. 7 is to be used. The mask 200 is provided with a plurality of openings 210 and an opening 220. When the organic light-emitting material is evaporated, the mask 200 is placed above the pixel defining layer 46 with the opening 220 of the mask 200 corresponding to the second display region 102, and a plurality of openings 210 of the mask 200 being in one-to-one correspondence with a plurality of light-emitting regions 1011. Then, the organic light-emitting material is evaporated through the openings 210 and the opening 220 of the mask 200.

At step 230, a cathode layer is formed on the conductive layer 20, where the cathode layer includes a plurality of cathode blocks covering the second display region or the light-emitting regions, and the cathode blocks of two adjacent light-emitting regions are electrically connected by the connection portion between the two adjacent light-emitting regions.

In an embodiment of the present disclosure, step 230 may be completed through the following steps 236-238.

At step 236, a mask is provided, where the mask includes openings corresponding to the plurality of cathode blocks.

Figure 8:
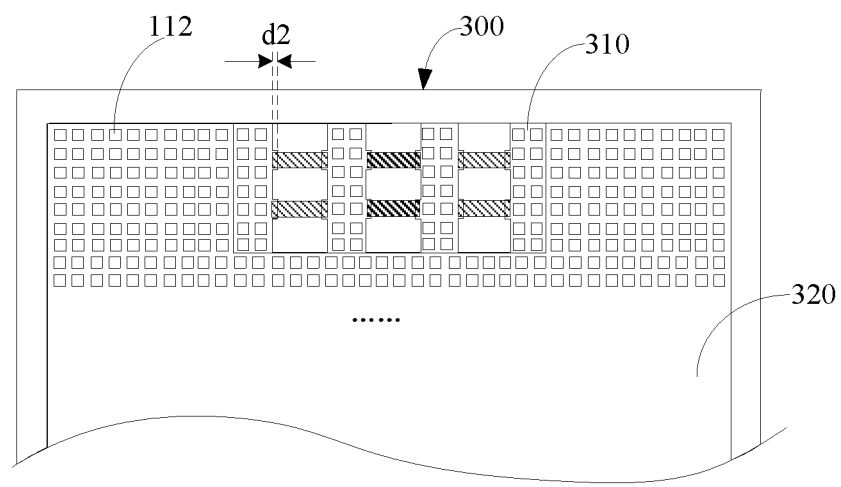
FIG. 8 is a schematic diagram of evaporating cathodes using a mask according to an embodiment of the present disclosure.

Referring to FIG. 8, the mask 300 includes a plurality of openings 310 and an opening 320. A plurality of openings 310 are in one-to-one correspondence with a plurality of light-emitting regions 1011 and shaped substantially like the corresponding light-emitting regions 1011, and the opening 320 is shaped substantially like the second display region 102.

At step 237, the mask is placed on the conductive layer, where an orthographic projection of an opening corresponding to the light-emitting region on the substrate overlaps with an orthographic projection of the connection portion adjacent to the opening on the substrate.

In this way, the cathode evaporated through the openings 310 of the mask 300 partially overlaps with the connection portion 30 to ensure a good electrical connection effect between the connection portion 30 and the adjacent cathode blocks.

In an embodiment of the present disclosure, in a direction pointing to the light-emitting region from the light-transmitting region, a size of an overlapping portion of the orthographic projection of the opening on the substrate and the orthographic projection of the connection portion adjacent to the opening on the substrate is in the range of [500 μm, 1000 μm]. Therefore, the size of an overlapping portion of the prepared cathode block and the adjacent connection portion 30 is relatively large, which ensures the good electrical connection effect of the cathode block formed by the mask 300 and the adjacent connection portion 30, thus helping to avoid poor contact of the cathode block and the adjacent connection portion 30. A size d2 of the overlapping portion of the orthographic projection of the opening 310 on the substrate 10 and the orthographic projection of the connection portion 30 adjacent to the opening 310 on the substrate 10 in a first direction may be 500 μm, 600 μm, 700 μm, 800 μm, 900 μm, 1000 μm, or the like, where the first direction refers to a direction pointing to the light-emitting region 1011 from the light-transmitting region 1012.

At step 238, the cathode blocks are formed through the openings of the mask.

At this step, the cathode blocks may be formed using an evaporation process in the openings of the mask.

In an embodiment of the present disclosure, in the first display region, a ratio of a total area of the light-emitting regions to a total area of the light-transmitting regions is in the range of 1:1 to 1:2.

In an embodiment of the present disclosure, at least two connection portions are disposed in a same light-transmitting region, and arranged in parallel along the first direction.

In the manufacturing method of a display substrate according to embodiments of the present disclosure, the display substrate includes the first display region 101 and the second display region 102. The light transmittance of the first display region 101 is greater than the light transmittance of the second display region 102, and therefore light sensing elements may be disposed under the first display region 101 to realize full-screen display of the display substrate under a precondition of normal operation of the light sensing elements. The connection portion 30 is formed in the light-transmitting region 1012 to electrically connect the cathode blocks of two adjacent light-emitting regions, so that the cathode blocks of different light-emitting regions 1011 in the first display region 101 can be electrically connected, thereby ensuring normal display of the display substrate 100. Further, the arrangement of the connection portion 30 may reduce an area of the cathode block in the light-transmitting region 1012, thereby facilitating increasing the light transmittance of the first display region 101. Since the conductive layer 20 and the connection portion 30 of the display substrate 100 are formed in a same process procedure, the formation of the connection portion 30 will not increase the number of masks, thereby facilitating reducing complexity of the manufacturing process.

Since method embodiments substantially correspond to product embodiments, descriptions of relevant details and beneficial effects may be referred to partial descriptions of the product embodiments, which will not be repeated herein.

At least one embodiment of the present disclosure further provides a display device, including the display substrate 100 according to any one of the above embodiments.

The display device may be any product or component having a display function such as a liquid crystal display panel, an Organic Light Emitting Diode (OLED) display panel, a mini-LED display panel, electronic paper, a mobile phone, a tablet computer, a television, a laptop, a digital photo frame and a navigator.

In some embodiments of the present disclosure, the display device includes a housing and a display panel connected with the housing. For example, the display panel is embedded into the housing.

It is to be noted that the sizes of layers and regions may be exaggerated for clarity of illustration in the drawings. For example, the size of the first display region is larger for clearer descriptions in FIG. 1, but the actual size of the first display region is far smaller than the size shown in FIG. 1. Further, it may be understood that when an element or layer is "on" another element or layer, it means such element or layer may be directly on the another element or there may be an intermediate layer therebetween. In addition, it may be understood that when an element or layer is "under" another element or layer, it means such element or layer is directly under the another element, or there may be at least one intermediate layer or element therebetween. In addition, it may also be understood that when a layer or element is "between" two layers or two elements, it means such layer or element may be a unique layer between two layers or two elements, or there may also be at least one intermediate layer or element therebetween. Like reference numerals refer to like elements throughout the specification.

After considering the specification and practicing the present disclosure, persons skilled in the art may easily conceive of other implementations of the present disclosure. The present disclosure is intended to include any variations, uses and adaptive changes of the present disclosure, and these variations, uses and adaptive changes follow the general principle of the present disclosure and include common knowledge or conventional technical means in the art not disclosed in the present disclosure. The specification and embodiments herein are intended to be illustrative only, and the real scope and spirit of the present disclosure are indicated by the following claims of the present disclosure.

It is to be understood that the present disclosure is not limited to the precise structure described above and shown in the drawings, and various modifications and changes may be made without departing from the scope thereof. The scope of the present disclosure is limited only by the appended claims.

The invention claimed is:

1. A display substrate, comprising a first display region disposed on a substrate, wherein the first display region comprises a plurality of light-emitting regions and a plurality of light-transmitting regions, each of the plurality of light-emitting regions comprises a plurality of sub-pixels, the plurality of light-emitting regions are arranged in an array, the plurality of light-transmitting regions are arranged in an array, the plurality of light-emitting regions and the plurality of light-transmitting regions are arranged alternately, and two adjacent light-emitting regions of the plurality of light-emitting regions are separated by one corresponding light-transmitting region of the plurality of light-transmitting regions;

each of the plurality of light-emitting regions comprises:
a conductive layer; and
a cathode block disposed on the conductive layer;
wherein each of the plurality of light-transmitting regions comprises one or more connection portions, each of the one or more connection portions has a smaller area than an area of the light-transmitting region, the one or more connection portions are located in a same layer and made of a same material as the conductive layer, and respectively configured to electrically connect cathode blocks of two corresponding adjacent light-emitting regions of the plurality of light-transmitting regions, and
wherein the display substrate further comprises a pixel circuit layer, the pixel circuit layer is located in each of the plurality of light-emitting regions and comprises the conductive layer, the pixel circuit layer comprises a thin film transistor and a capacitor, the thin film transistor comprises a gate electrode, a source electrode and a drain electrode, the capacitor comprises a first plate and a second plate located above the first plate, and the conductive layer is one of the gate electrode, the source electrode and the second plate.

2. The display substrate according to claim 1, wherein the conductive layer is the gate electrode.

3. The display substrate according to claim 1, wherein the conductive layer is the source electrode.

4. The display substrate according to claim 1, wherein the conductive layer is the second plate.

5. The display substrate according to claim 1, wherein an orthographic projection of the one or more connection portions on the substrate overlaps with an orthographic projection of the cathode block in electrical connection with the one or more connection portions on the substrate.

6. The display substrate according to claim 5, wherein a size of an overlapping portion of the orthographic projection of the one or more connection portions on the substrate and the orthographic projection of the cathode block in electrical connection with the one or more connection portions on the substrate is in the range of [500 μm, 1000 μm] in a first direction, wherein the first direction is a direction pointing to a light-emitting region of the plurality of light-emitting regions from a light-transmitting region of the plurality of the light-transmitting regions.

7. The display substrate according to claim 1, wherein in the first display region, a ratio of a total area of the light-emitting regions to a total area of the light-transmitting regions is in the range of 1:1 to 1:2.

8. The display substrate according to claim 1, wherein at least two connection portions are disposed in a same light-transmitting region and arranged in parallel in a direction parallel to a first direction.

9. The display substrate according to claim 1, further comprising a second display region, wherein a light transmittance of the second display region is smaller than a light transmittance of the first display region.

10. A display device, comprising the display substrate according to claim 1.

11. A manufacturing method of a display substrate, wherein the display substrate comprises a first display region, the first display region comprises a plurality of light-emitting regions and a plurality of light-transmitting regions, each of the plurality of light-emitting regions comprises a plurality of sub-pixels, the plurality of light-emitting regions are arranged in an array, the plurality of light-transmitting regions are arranged in an array, the plurality of light-emitting regions and the plurality of light-transmitting regions are arranged alternately, and two adjacent light-emitting regions of the plurality of light-emitting regions are separated by one corresponding light-transmitting region of the plurality of light-transmitting regions;

the manufacturing method of the display substrate comprises:
providing a substrate;
forming a conductive layer located in each of the plurality of light-emitting regions and one or more connection portions located in each of the plurality of light-transmitting regions on the substrate, wherein the conductive layer and the one or more connection portions are formed in a same process procedure; and
forming a plurality of cathode blocks on the conductive layers of the plurality of light-emitting regions, wherein the cathode blocks cover the light-emitting regions respectively, and the cathode blocks of the two adjacent light-emitting regions are electrically connected by the one or more connection portions in the one corresponding light-transmitting region between the two adjacent light-emitting regions, wherein the display substrate further comprises a pixel circuit layer, the pixel circuit layer comprises a plurality of thin film transistors and a plurality of capacitors, each of the plurality of thin film transistors comprises a gate electrode, a source electrode and a drain electrode, each of the plurality of capacitors comprises a first plate and a second plate located above the first plate, and the conductive layer is one of the gate electrode, the source electrode and the second plate.

12. The manufacturing method of the display substrate according to claim 11, wherein the conductive layer is the gate electrode.

13. The manufacturing method of the display substrate according to claim 12, wherein the first plate and the conductive layer are formed in a same process procedure; after the conductive layer and the one or more connection portions are formed on the substrate, the manufacturing method further comprises:
   forming a capacitor insulation layer covering the first display region on the gate electrode and etching the capacitor insulation layer to expose the one or more connection portions;
   forming the second plate on the capacitor insulation layer;
   forming an interlayer dielectric layer covering the first display region on the second plate and etching the interlayer dielectric layer to expose the one or more connection portions;
   forming source electrodes and drain electrodes on the interlayer dielectric layer;
   forming a planarization layer covering the first display region on the source electrodes and etching the planarization layer to expose the one or more connection portions;
   forming a plurality of anodes on the planarization layer; and
   forming a pixel defining layer covering the first display region on the anodes and etching the pixel defining layer to expose the one or more connection portions.

14. The manufacturing method of the display substrate according to claim 12, wherein the first plate and the conductive layer are formed in a same process procedure; after the conductive layer and the one or more connection portions are formed on the substrate, the manufacturing method further comprises:
   forming a capacitor insulation covering the first display region on the gate electrode;
   forming the second plate on the capacitor insulation layer;
   forming an interlayer dielectric layer covering the first display region on the second plate;
   forming source electrodes and drain electrodes on the interlayer dielectric layer;
   forming a planarization layer covering the first display region on the source electrodes;
   forming a plurality of anodes on the planarization layer;
   forming a pixel defining layer covering the first display region on the anodes; and
   etching the pixel defining layer, the planarization layer, the interlayer dielectric layer and the capacitor insulation layer simultaneously to expose the one or more connection portions.

15. The manufacturing method of the display substrate according to claim 11, wherein forming the plurality of cathode blocks on the conductive layers comprises:
   providing a mask comprising a plurality of openings corresponding to the plurality of cathode blocks;
   placing the mask on the conductive layers, wherein an orthographic projection of an opening corresponding to each of the plurality of cathode blocks on the substrate overlaps with an orthographic projection of the one or more connection portions adjacent to the opening on the substrate; and
   forming the plurality of cathode blocks through the openings of the mask.

16. The manufacturing method of the display substrate according to claim 15, wherein a size of an overlapping portion of the orthographic projection of the opening on the substrate and the orthographic projection of the one or more connection portions adjacent to the opening on the substrate is in the range of [500 μm, 1000 μm] in a first direction, wherein the first direction is a direction pointing to a light-emitting region of the plurality of light-emitting regions from a light-transmitting region of the plurality of the light-transmitting regions.

17. The manufacturing method of the display substrate according to claim 11, further comprising forming a second display region, wherein a light transmittance of the second display region is smaller than a light transmittance of the first display region.

18. The display substrate according to claim 1, wherein a direction pointing to a light-emitting region of the plurality of light-emitting regions from a light-transmitting region of the plurality of the light-transmitting regions is a first direction, and a size of each of the one or more connection portions in a second direction perpendicular to the first direction along a surface of the display substrate is less than a size of the light-transmitting region in the second direction.

* * * * *